United States Patent
Ho et al.

(10) Patent No.: US 9,812,410 B2
(45) Date of Patent: Nov. 7, 2017

(54) LID STRUCTURE FOR A SEMICONDUCTOR DEVICE PACKAGE AND METHOD FOR FORMING THE SAME

(71) Applicant: TAIWAN SEMICONDUCTOR MANUFACTURING CO., LTD., Hsinchu (TW)

(72) Inventors: Kuan-Lin Ho, Hsinchu (TW); Chin-Liang Chen, Kaohsiung (TW); Chi-Yang Yu, Taoyuan (TW); Yu-Chih Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/985,504

(22) Filed: Dec. 31, 2015

(65) Prior Publication Data

US 2017/0194268 A1 Jul. 6, 2017

(51) Int. Cl.
| | |
|---|---|
| H01L 23/12 | (2006.01) |
| H01L 23/58 | (2006.01) |
| H01L 23/00 | (2006.01) |
| H01L 21/48 | (2006.01) |
| H01L 23/367 | (2006.01) |
| H01L 21/78 | (2006.01) |
| H01L 23/498 | (2006.01) |

(Continued)

(52) U.S. Cl.
CPC ........ *H01L 23/585* (2013.01); *H01L 21/4853* (2013.01); *H01L 21/78* (2013.01); *H01L 23/3107* (2013.01); *H01L 23/367* (2013.01); *H01L 23/3675* (2013.01); *H01L 23/49816* (2013.01); *H01L 24/11* (2013.01); *H01L 24/17* (2013.01); *H01L 24/27* (2013.01); *H01L 24/32* (2013.01); *H01L 25/0657* (2013.01); *H01L 2224/0401* (2013.01)

(58) Field of Classification Search
CPC ..... H01L 21/56; H01L 23/3107; H01L 23/36; H01L 23/3675; H01L 23/49816; H01L 25/0657; H01L 23/585; H01L 21/4853; H01L 21/78; H01L 24/11; H01L 24/17; H01L 24/27; H01L 24/03; H01L 25/06572

See application file for complete search history.

(56) References Cited

U.S. PATENT DOCUMENTS

| | | | |
|---|---|---|---|
| 6,844,622 B2 * | 1/2005 | Hsiao | H01L 21/561 257/706 |
| 7,078,800 B2 * | 7/2006 | Kwon | H01L 23/36 257/704 |

(Continued)

*Primary Examiner* — Alonzo Chambliss
(74) *Attorney, Agent, or Firm* — Slater Matsil, LLP

(57) ABSTRACT

A semiconductor device structure and method for forming the same are provided. The semiconductor device structure includes a substrate and a die structure formed over the substrate. The semiconductor device structure also includes a lid structure formed over the die structure. The lid structure includes a top portion with a top length and a bottom portion with a bottom length, and the top length is greater than the bottom length. The semiconductor device structure also includes a package layer formed between the lid structure and the die structure, and a sidewall of the bottom portion of the lid structure is not aligned with a sidewall of the die structure.

20 Claims, 18 Drawing Sheets

(51) Int. Cl.
*H01L 23/31* (2006.01)
*H01L 25/065* (2006.01)

(56) References Cited

U.S. PATENT DOCUMENTS

| | | | |
|---|---|---|---|
| 7,361,986 B2* | 4/2008 | Yuan | H01L 23/4334 |
| | | | 257/675 |
| 2003/0034569 A1 | 2/2003 | Caletka et al. | |
| 2006/0063306 A1* | 3/2006 | Choi | H01L 23/3128 |
| | | | 438/110 |
| 2006/0091527 A1* | 5/2006 | Tsai | H01L 23/3128 |
| | | | 257/706 |
| 2006/0113663 A1* | 6/2006 | Yuan | H01L 23/4334 |
| | | | 257/718 |
| 2006/0231944 A1 | 10/2006 | Huang et al. | |
| 2007/0018310 A1 | 1/2007 | Sato | |
| 2007/0181997 A1 | 8/2007 | Ahr et al. | |
| 2010/0001410 A1 | 1/2010 | Kang | |
| 2010/0109152 A1* | 5/2010 | Kariyazaki | H01L 23/055 |
| | | | 257/704 |
| 2010/0276799 A1* | 11/2010 | Heng | H01L 21/50 |
| | | | 257/704 |
| 2012/0018869 A1 | 1/2012 | Kolan et al. | |
| 2014/0353838 A1 | 12/2014 | Lin et al. | |
| 2015/0228632 A1 | 8/2015 | Yu et al. | |
| 2016/0181176 A1* | 6/2016 | Yu | H01L 23/3675 |
| | | | 257/712 |

* cited by examiner

LID STRUCTURE FOR A SEMICONDUCTOR DEVICE PACKAGE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting the new packaging technologies, various packages with different or similar functions are integrated together.

Although existing package structures and methods of fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3D' shows an embodiment of a semiconductor device structure, in accordance with some embodiments of the disclosure.

FIG. 7B' shows a modified embodiment of FIG. 7B, in accordance with some embodiments of the disclosure.

DETAILED DESCRIPTION

Figure 1A:
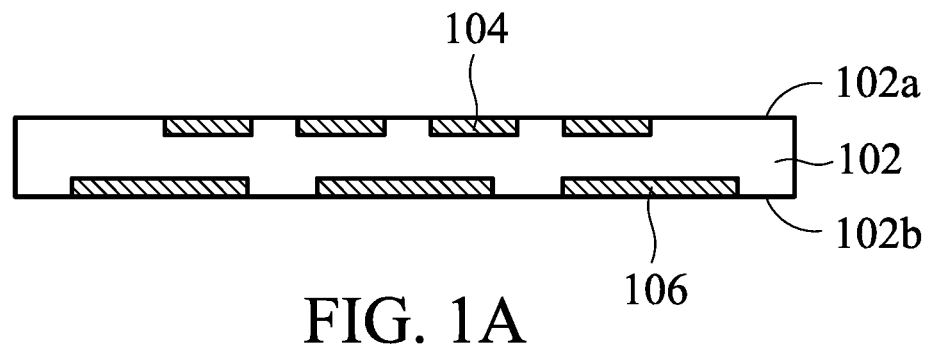
FIGS. 1A-1D show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or another active chip in a two-and-a-half-dimensional integrated circuit (2.5DIC) structure or a three-dimensional IC (3DIC) structure.

Embodiments for a semiconductor device structure and method for forming the same are provided. FIGS. 1A-1D show cross-sectional representations of various stages of forming a semiconductor device structure 100a, in accordance with some embodiments of the disclosure.

Referring to FIG. 1A, a substrate 102 is provided. In some embodiments, the substrate 102 is made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

In some embodiments, the substrate 102 is a package substrate. The package substrate may be a supporting materials that may carry the conductive pads needed to receive conductive terminals. The package substrate may be made of bismaleimide triazine (BT) resin, FR-4 (a composite material composed of woven fiberglass cloth with an epoxy resin binder that is flame resistant), ceramic, glass, plastic, tape, film, or a combination thereof. In some embodiments, the package substrate is a multiple-layer circuit board. In some other embodiments, the substrate 102 comprises an interposer substrate.

The substrate 102 may include one or more passive components (not shown), such as resistors and capacitors, embedded inside. Various processes are performed to form the passive components, such as deposition, etching, implantation, photolithography, annealing, and/or other applicable processes.

The substrate 102 may include one or more interconnect structures, such as redistribution layers (RDLs) or post-passivation interconnect (PPI) structures (not shown). The substrate 102 may include a plurality of through-vias formed therein. The interconnect structures are made of metal materials, such as copper (Cu), copper alloy, aluminum (Al), aluminum alloy, tungsten (W), tungsten alloy, titanium (Ti), titanium alloy, tantalum (Ta), or tantalum alloy. Alternatively, the substrate 102 may comprise other materials and/or components.

The substrate 102 has a front side 102a and a back side 102b. The pads 104 are formed on the front side 102a of the substrate, and pads 106 are formed on the back side 102b of the substrate 102. In other words, the pads 104 are formed on a top surface of the substrate 102, and the pads 106 are formed on a bottom surface of the substrate 102.

Figure 1B:
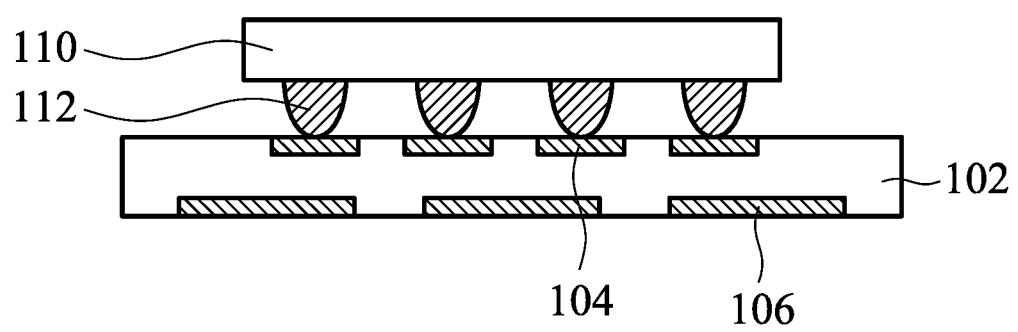

Afterwards, a die structure 110 is formed or attached on the substrate 102, as shown in FIG. 1B, in accordance with some embodiments of the disclosure. Some electrical connectors 112 are formed over the die structure 110. More specifically, the electrical connectors 112 are formed on a bottom surface of the die structure 110. The electrical connectors 112 are electrically connected to the pads 104.

In some embodiments, the electrical connector 112 includes a solder ball, a metal pillar, or another applicable connector. In some embodiments, an under bump metallurgy (UBM) layer (not shown) is formed below the electrical connector 112. In some embodiments, the electrical connectors 112 are Controlled Collapse Chip Connections (C4). The UBM layer may be made of conductive material, such as copper (Cu), copper alloy, aluminum (Al), aluminum alloy, tungsten (W), tungsten alloy, titanium (Ti), titanium alloy, tantalum (Ta) or tantalum alloy.

The electrical connectors 112 are attached to the die structure 110 by using a ball drop process or a solder bath process. Alternatively, the electrical connectors 112 may include other types of connectors and may be attached using other methods.

In some embodiments, the die structure 110 is formed on the substrate 102 by using a flip-chip mounting process. For example, the electrical connectors 112 are formed on a top surface of the die structure 110, the die structure 110 is inverted, and the electrical connectors 112 face, and are coupled to, the front side 102a of the substrate 102. Alternatively, other methods may be used to attach the die structure 110 to the substrate 102.

Figure 1C:
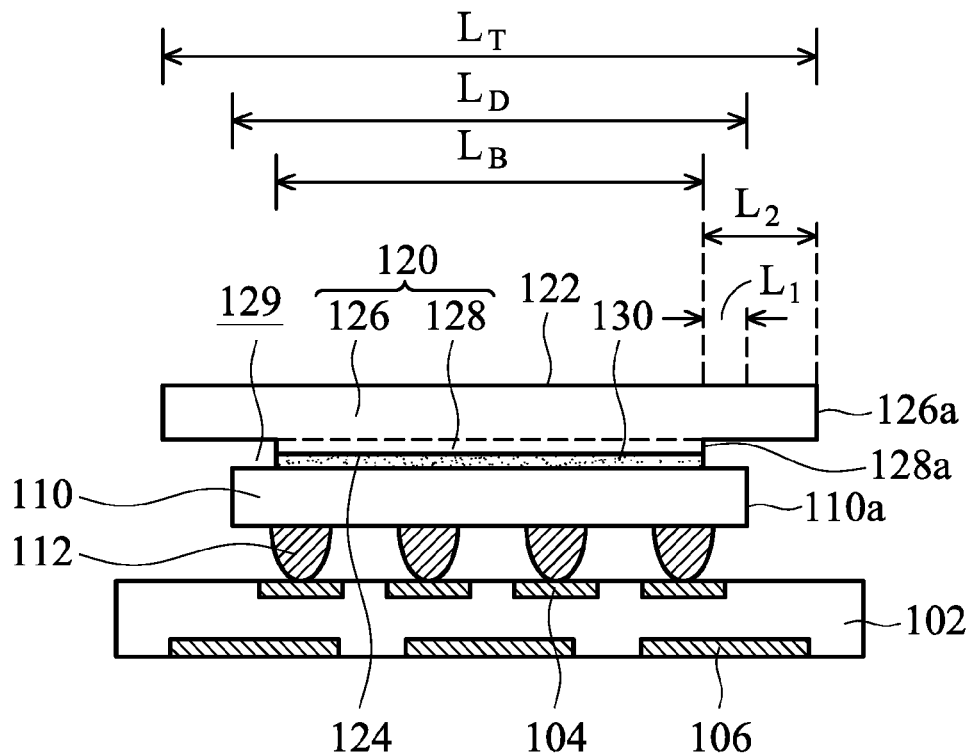

Afterwards, a lid structure 120 is formed over the die structure 110, as shown in FIG. 1C, in accordance with some embodiments of the disclosure. The lid structure 120 acts as a cap for the semiconductor device structure 100a and as a heat spreader. In some embodiments, the lid structure 120 is mounted over the die structure 110 to dissipate heat generated by the die structure 110. The lid structure 120 has a substantially flat top surface.

The lid structure 120 has a T-like shape. The lid structure 120 has a top surface 122 and a bottom surface 124 which faces the die structure 110. The lid structure 120 includes a top portion 126 and a bottom portion 128. The dashed line shown in FIG. 1C is used to define the profile of the top portion 126 and the bottom portion 128. There is no real interface between the top portion 126 and the bottom portion 128. The top portion 126 has a rectangular shape, and the bottom portion 128 also has a rectangular shape. The size of the top portion 126 is greater than that of the bottom portion 128. Therefore, a portion of a top surface of the die structure 110 is exposed. The exposed portion is not covered by the lid structure 120.

It should be noted that the sidewalls 126a of the top portion 126 are not aligned with the sidewalls 128a of the bottom portion 128. In addition, the sidewalls 126a of the top portion 126 are not aligned with the sidewalls 110a of the die structure 110. The sidewalls 128a of the bottom portion 128 are not aligned with the sidewalls 110a of the die structure 110. The top portion 126 of the lid structure 120 extends beyond the sidewalls 110a of the die structure 110.

If the sidewalls of the lid structure are aligned with the sidewalls of the die structure, some cracks, especially edge cracks, or chipping may occur at the edge of the die structure due to edge stress. As mentioned above, the sidewalls 126a and the sidewalls 128a are not aligned with each other, and discontinuous sidewalls or edges are formed. Therefore, the sidewall profile of the lid structure 120 reduces stress concentration at the sidewalls or the edges of the die structure 110, and therefore the risk of the die cracking or chipping is reduced.

The die structure 110 has a die length $L_D$. The top surface 122 has a top length $L_T$, and the bottom surface 124 has a bottom length $L_B$. In other words, the top portion 126 has a top length $L_T$, and the bottom portion has a bottom length $L_B$. The top length $L_T$ is greater than the bottom length $L_B$, and the die length $L_D$ is greater than the bottom length $L_B$. In some embodiments, a ratio of the bottom length $L_B$ to the top length $L_T$ is in a range from about 50% to about 100%. When the ratio is within the above-mentioned range, problems such as the die cracking or chipping are reduced.

There is a first length $L_1$ between the sidewalls 110a of the die structure 110 and the sidewalls 128a of the bottom portion 128 of the lid structure 120. In some embodiments, a ratio of the first length $L_1$ to the top length $L_T$ is in a range from about 0.01% to about 25%. A second length $L_2$ is between the sidewalls 126a of the top portion 126 and the sidewalls 128a of the bottom portion 128 of the lid structure 120. In some embodiments, a ratio of the second length $L_2$ to the top length $L_T$ is in a range from about 0.01% to about 25%. When the ratio is within the above-mentioned range, the risk of the die cracking or chipping is reduced.

A recess 129 is formed between the lid structure 120 and the die structure 110. A package layer 150 (shown in FIG. 1D, will be formed in the subsequent process) is formed in the recess 129.

The lid structure 120 may be made of a heat conducting material, such as a metal like aluminum (Al), aluminum (Al) alloy, copper (Cu), copper alloy, nickel (Ni), nickel alloy or a combination thereof. The lid structure 120 may alternatively be made of ceramic, stainless steel or the like. The lid structure 120 is formed by a stamping process.

As shown in FIG. 1C, an adhesive layer 130 is formed between the die structure 110 and the lid structure 120. The bottom surface 124 of the lid structure 120 is in direct contact with the adhesion layer 130. The adhesive layer 130 couples the die structure 110 to the lid structure 120 to dissipate heat generated in the die structure 120 to the ambient air.

In some embodiments, the adhesive layer 130 includes thermal interface material (TIM). In some embodiments, the TIM may be a thermally conductive and electrically insulating material, such as an epoxy; for example, an epoxy mixed with a metal like silver, gold, or a combination thereof.

In some embodiments, the adhesion layer 130 is firstly formed on the die structure 110, and then the lid structure 120 is formed on the adhesion layer 130. In some other embodiments, the adhesion layer 130 is on the lid structure 120 in advance, and the lid structure 120 is attached to the die structure 110 by the adhesion layer 130.

After the lid structure 120 is formed, the package layer 150 is filled in the spaces between the die structure 110 and the lid structure 120, as in FIG. 1 D, in accordance with some embodiments of the disclosure. The die structure 110 is surrounded by the package layer 150. More specifically, the sidewalls 110a of the die structure 110, the sidewalls 126a of top portion 126, and sidewalls 128a of the bottom portion 128 are in direct contact with the package layer 150. A portion of the package layer 150 is formed in the recess 129. In addition, a portion of the package layer 150 is formed between the die structure 110 and the substrate 102 and around the electrical connectors 112.

After the package layer 150 is formed, the electrical connectors 160 are formed over the back side 102b of the substrate 102. The electrical connectors 160 are configured to transport the signal to outer environment. The electrical connectors 160 include a solder ball, a metal pillar, or another applicable connector. The electrical connectors 160 are made of conductive materials, such as tin (Sn), copper (Cu), gold (Au), silver (Ag), alloys thereof, or other suitable materials. In some embodiments, an under bump metallurgy (UBM) layer (not shown) is formed below the electrical connectors 160.

The package layer 150 includes a molding compound, an underfill material, or a combination thereof. In some embodiments, the package layer 150 is made of molding compound, such as liquid epoxy, deformable gel, silicon rubber, or the like. In some embodiments, the molding compound is dispensed over the die structure 110 and the substrate 102, and then is cured by using a heating process, infrared (IR) energy expose process, an ultraviolet (UV) light expose process, or another applicable process.

In a comparative embodiment, a package layer is formed before a lid structure, a top surface of the package layer will be level with a top surface of a die structure. As a result, a co-planar surface is constructed. Next, a lid structure is formed over the co-planar surface. In order to tightly cover the co-planar surface, the lid structure will cover the entire top surface of the die structure. The amount of the package layer is limited by the fabrication sequence. Furthermore, the warpage problem may occur due to small amount of the package layer.

Figure 1D:
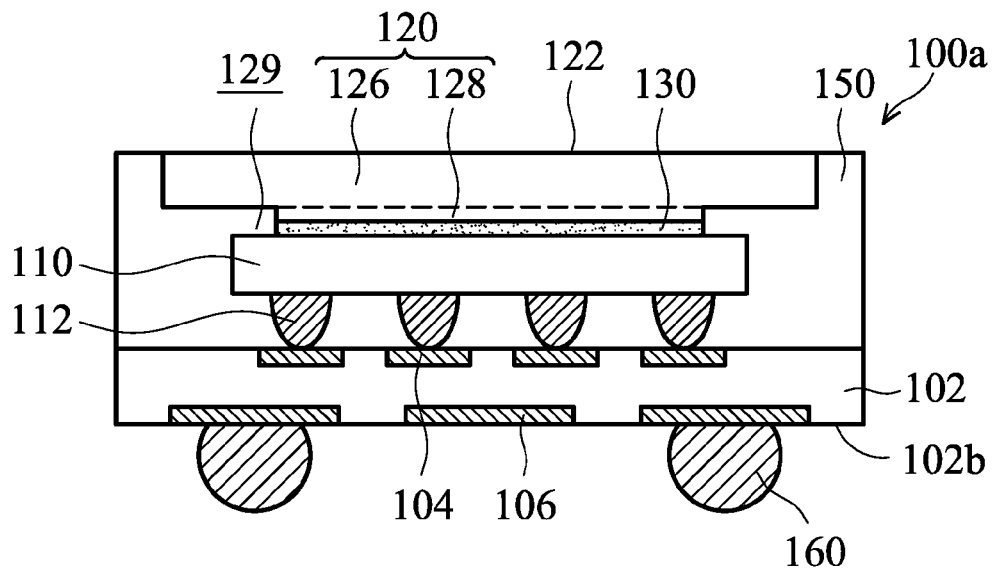

It should be noted that, in some embodiments, as shown in FIG. 1D, a top surface of the package layer 150 is level with the top surface 122 of the lid structure 120. In addition, the top surface of the package layer 150 is higher than the top surface of the die structure 110. The package layer 150 is formed not only adjoining the lid structure 120, but also in the recess 129 which is between the die structure 110 and the lid structure 120. More specifically, the package layer 150 is formed over a portion of a top surface of the die structure 110. The amount of the package layer 150 is greater than that in the comparative embodiment, and therefore the warpage problem is reduced due to there being more package layers 150.

Figure 2A:
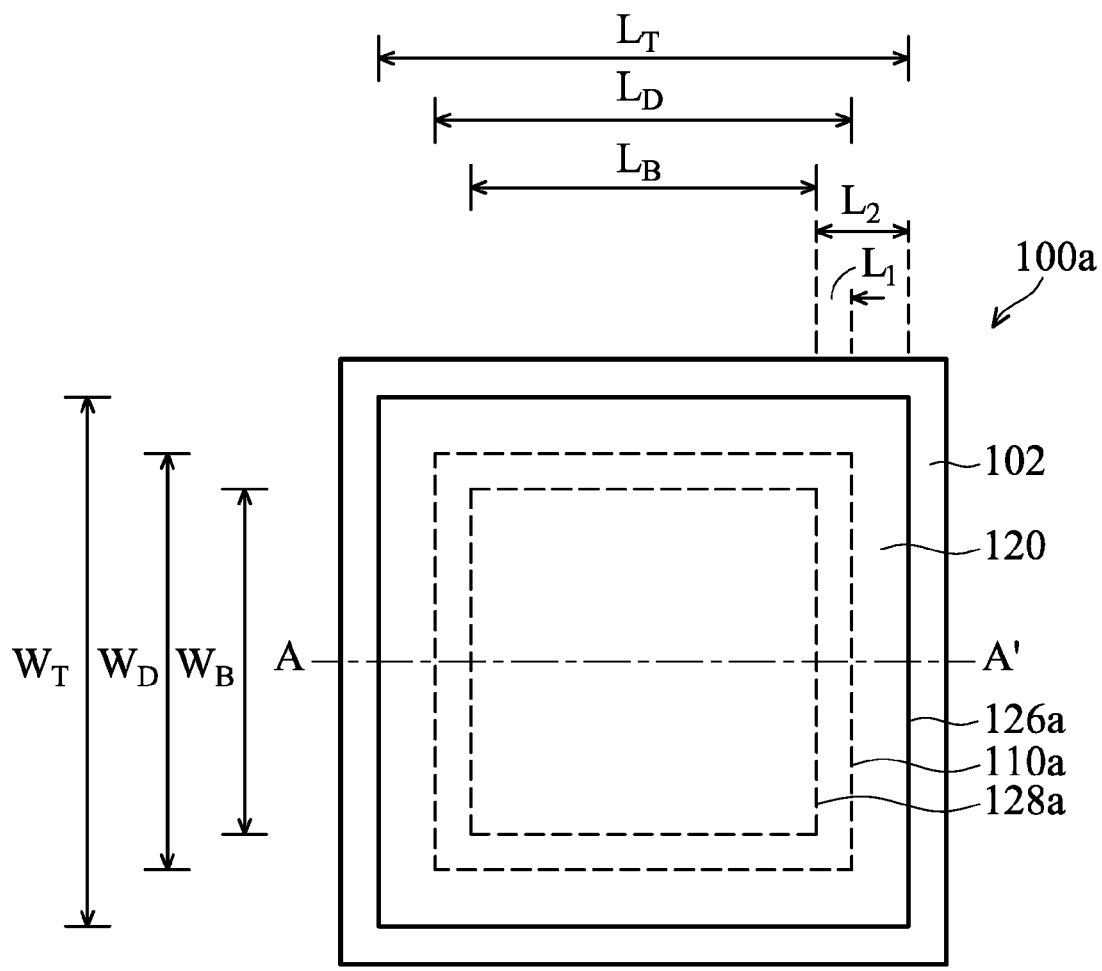
FIG. 2A shows a top-view representation of a semiconductor device structure of FIG. 1D, in accordance with some embodiments of the disclosure.

FIG. 2A shows a top-view representation of the semiconductor device structure 100a of FIG. 1D, in accordance with some embodiments of the disclosure. FIG. 1D is the cross-sectional representation along the AA' line of FIG. 2A. The lid structure 120 has a rectangular or square shape when seen from the top view. In the cross-sectional representation, the lid structure 120 has a T-like shape. The bottom portion 128 of the lid structure 120 and the die structure 110 are covered by the top portion 126 of the lid structure 120, and therefore the bottom portion 128 of the lid structure 120 and the die structure 110 are shown as a dashed line in FIG. 2A.

The top surface 122 of the lid structure 120 has a top length $L_T$ along an x-axis and a top width $W_T$ along a y-axis. The bottom surface 124 of the lid structure 120 has a bottom length $L_B$ along an x-axis and a bottom width $W_T$ along a y-axis. The die structure 110 has a die length $L_D$ along an x-axis and a die width $W_T$ along a y-axis. The top length $L_T$ may be greater than, equal to or smaller than the top width $W_T$. The bottom length $L_B$ may be greater than, equal to or smaller than the bottom width $W_B$. The die length $L_D$ may be greater than, equal to or smaller than the die width $W_D$.

It should be noted that the top length $L_T$ is greater than the die length $L_D$, and the die length $L_D$ is greater than the bottom length $L_B$. In addition, the top width $W_T$ is greater than the die width $W_D$, and the die width $W_D$ is greater than the bottom width $W_B$.

Figure 2B:
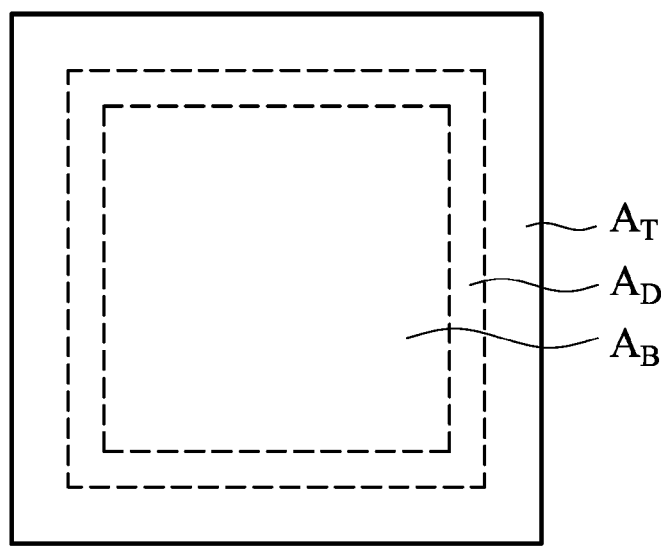
FIG. 2B shows the relationship of the areas of a top portion of a lid structure, a die structure, and a bottom portion of a lid structure, in accordance with some embodiments of the disclosure.

FIG. 2B shows a top-view representation of the semiconductor device structure 100a of FIG. 1 D, in accordance with some embodiments of the disclosure. FIG. 2B shows the relationship of the areas of the top portion 126 of the lid structure 120, the die structure 110, and the bottom portion 128 of the lid structure 120 in accordance with some embodiments of the disclosure.

The top portion 126 of the lid structure 120 has a top area $A_T$ (top length $L_T$ times top width $W_T$). The die structure 110 has a die area $A_D$ (die length $L_D$ times die width $W_D$). The bottom portion 128 of the lid structure 120 has a bottom area $A_B$ (bottom length $L_a$ times bottom width $W_B$). The top area $A_T$ is greater than the die area $A_D$, and the die area $A_D$ is greater than the bottom area $A_B$. In some embodiments, a ratio of the bottom area $A_B$ to the die area $A_D$ is in a range from about 50% to about 100%. In some embodiments, a ratio of the die area $A_D$ to the top area $A_T$ is in a range from about 50% to about 100%. When the ratio is within the above-mentioned range, problems such as edge cracking and die chipping can be avoided.

FIGS. 3A-3D show cross-sectional representations of various stages of forming a semiconductor device structure 100b, in accordance with some embodiments of the disclosure. A ring structure 210 is formed at a peripheral region of the substrate 102 around the die structure 110 (shown in FIG. 3B).

Figure 3A:
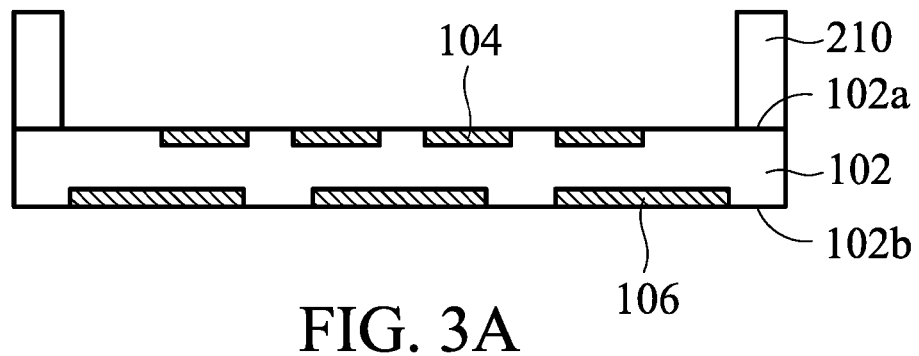
FIGS. 3A-3D show cross-sectional representations of various stages of forming a semiconductor device structure, in accordance with some embodiments of the disclosure.

As shown in FIG. 3A, the substrate 102 has a front side 102a and a back side 102b. The pads 104 are formed on the front side 102a, and the pads 106 are formed on the back side 102b. The ring structure 210 is formed over the front side 102a of the substrate 102. The function of the ring structure 210 is to provide an adequate support and warpage control. In addition, the ring structure 210 is configured to reduce mechanical strain on the die structure 110 (shown in FIG. 3B) during operation of the semiconductor device structure 100b, or during transportation of the semiconductor device structure 100b.

In some embodiments, the ring structure 210 is made of metal material, ceramic, or a combination thereof. The ring structure 210 is attached to the substrate 102 by using an adhesion layer (not shown). In some embodiments, the ring structure 210 is coupled to the substrate 102 manually, by using a pick-and-place machine process, or by using another applicable process.

Figure 3B:
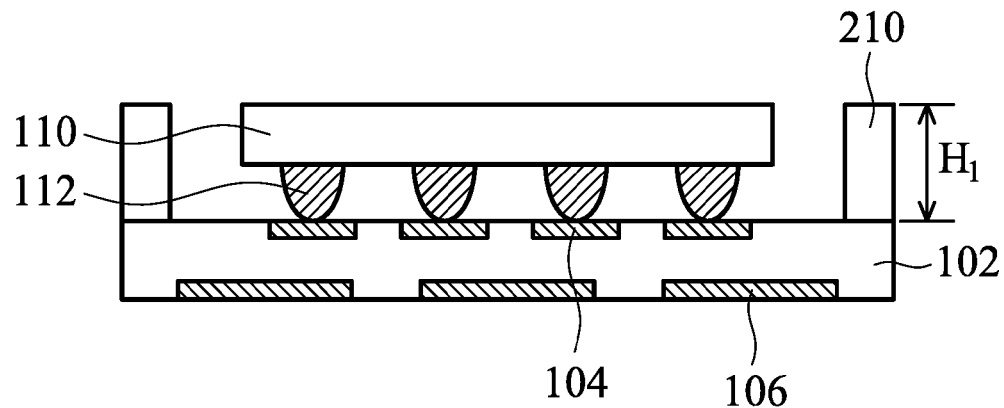

After the ring structure 210 is formed, the die structure 110 is formed over the substrate 102, as shown in FIG. 3B, in accordance with some embodiments of the disclosure.

The die structure 110 is formed over the pads 104 by the electrical connectors 112. The electrical connectors 112 are electrically connected to the pads 112 to transport the signal of the die structure 110 to outer environments. The ring structure 210 has a first height $H_1$ which is measured from the top surface of the substrate 102 to the top surface of the ring structure 210.

Figure 3C:
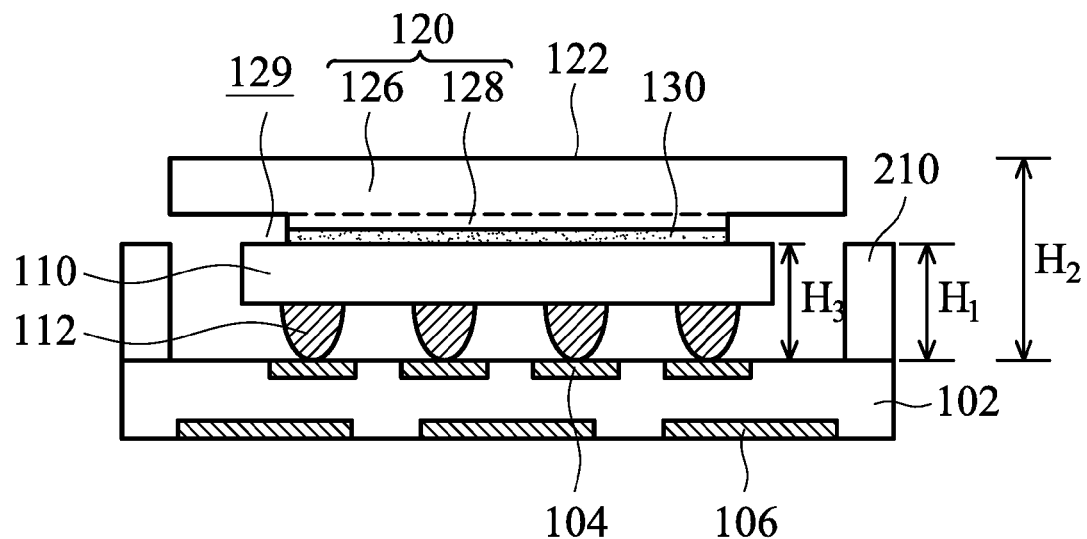

After the die structure 110 is formed, the lid structure 120 is formed over the die structure 120, as shown in FIG. 3C, in accordance with some embodiments of the disclosure. The lid structure 120 includes the top portion 126 (or extending portion) and the bottom portion 128 (or main portion). The top portion 126 extends far away from the die structure 110 along a horizontal direction. The top portion 126 (or extending portion) and the bottom portion 128 (or main portion) form a T-like shape.

The adhesion layer 130 is formed between the die structure 110 and the lid structure 120. In some embodiments, the adhesion layer 130 includes thermal interface material (TIM). The edges of the adhesion layer 130 are substantially aligned with the respective edges of the bottom portion 128 of the lid structure 120. In other words, the respective later edges of the adhesion layer 130 and bottom portion 128 of the lid structure 120 are coterminous.

A second height $H_2$ is measured from a top surface of the substrate 102 to the top surface 122 of the lid structure 120. It should be noted that the second height $H_2$ is greater than the first height $H_1$. A third height $H_3$ is measured from a front side 102a of the substrate 102 to a top surface of the die structure 110. In some embodiments, the third height $H_3$ is equal to or smaller than the first height $H_1$. This means that the top surface of the die structure 110 is level with or lower than the top surface of the ring structure 210. In some embodiments, a ratio ($H_1/H_2$) of the first height $H_1$ to the second height $H_2$ is in a range from about 0.01% to about 100%. When the ratio is within the above-mentioned range, the ring structure 210 may provide appropriate support.

Figure 3D:
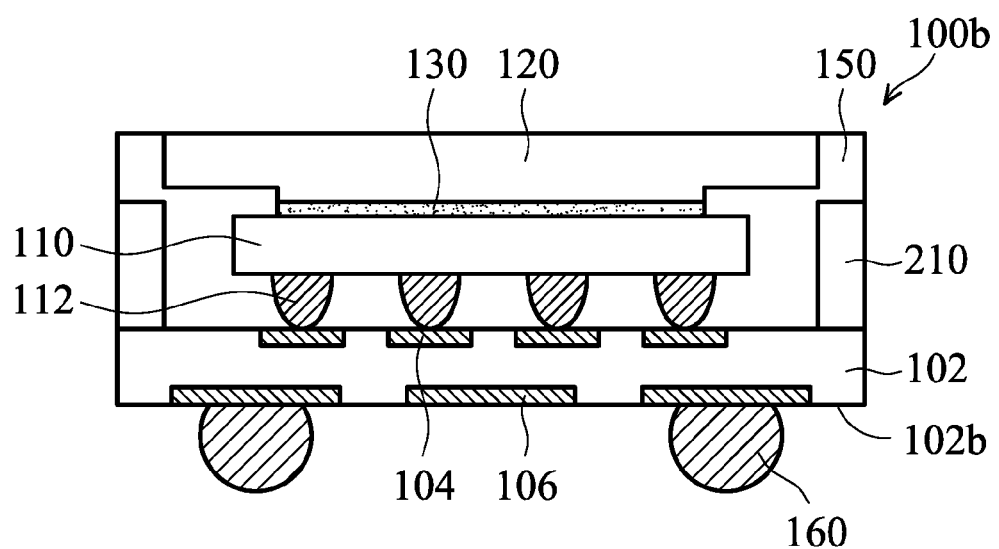
Figure 3D:
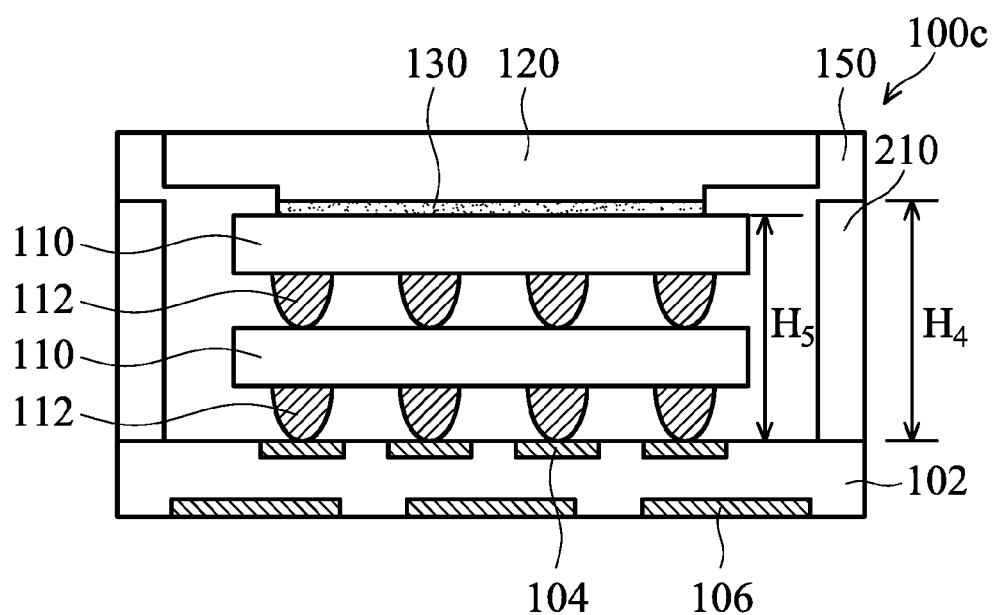

After the lid structure 120 is formed over the die structure 110, the package layer 150 is filled into the spaces between the ring structure 210 and the die structure 110, as shown in FIG. 3D, in accordance with some embodiments of the disclosure.

The package layer 150 is formed around the die structure 110 within the ring structure 210. In other words, the package layer 150 encapsulates the die structure 110. In some embodiments, the package layer 150 includes a molding compound in liquid form when it is applied. Next, the molding compound is cured using a curing process. The curing process includes a heating process.

It should be noted that the lid structure 120 has a T-like shape, and the recess 129 (shown in FIG. 3C) is formed between the top portion 126 and the bottom portion 128. The package layer 150 is filled into the recess 129. Therefore, a portion of the package layer 150 is formed over the top surface of the die structure 110.

Afterwards, the electrical connectors 160 are formed on the back side 102b of the substrate 102 to obtain the semiconductor device structure 100b.

FIG. 3D' shows an embodiment of a semiconductor device structure 100c, in accordance with some embodiments of the disclosure. FIG. 3D' is a modified embodiment of FIG. 3D. More than one die structure 110 is stacked over the substrate 102. The ring structure 210 has a fourth height $H_4$ which is measured from the top surface of the substrate 102 to the top surface of the ring structure 210. A fifth height $H_5$ is measured from a top surface of the die structure 110 to the top surface of the substrate 102. The fourth height $H_4$ is higher than the fifth height $H_5$. The first height $H_1$ of the ring structure 210 shown in FIG. 3C is lower than the fourth height $H_4$ of the ring structure 210 shown in FIG. 3D'.

FIGS. 4A-4D shows modified embodiments of a semiconductor device structure 100d-100g, in accordance with some embodiments of the disclosure.

Figure 4A:
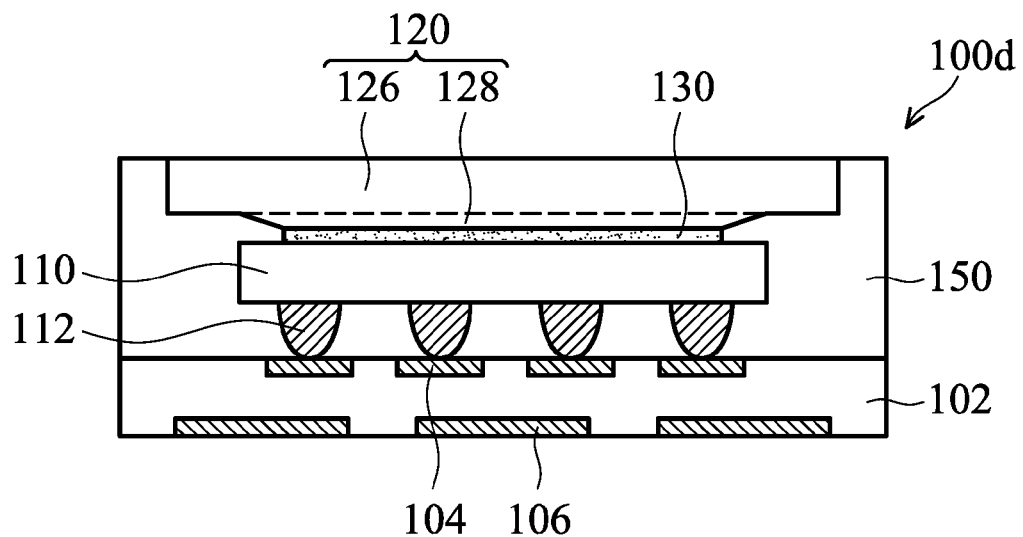
FIGS. 4A-4D shows modified embodiments of semiconductor device structures 100d-100g, in accordance with some embodiments of the disclosure.

As shown in FIG. 4A, the semiconductor device structure 100d includes the lid structure 120 formed over the die structure 110. The lid structure 120 includes the bottom portion 128 and the top portion 128 over the bottom portion 128. The bottom portion 128 has sloped sidewalls which are not vertical to the top surface of the die structure 110.

Figure 4B:
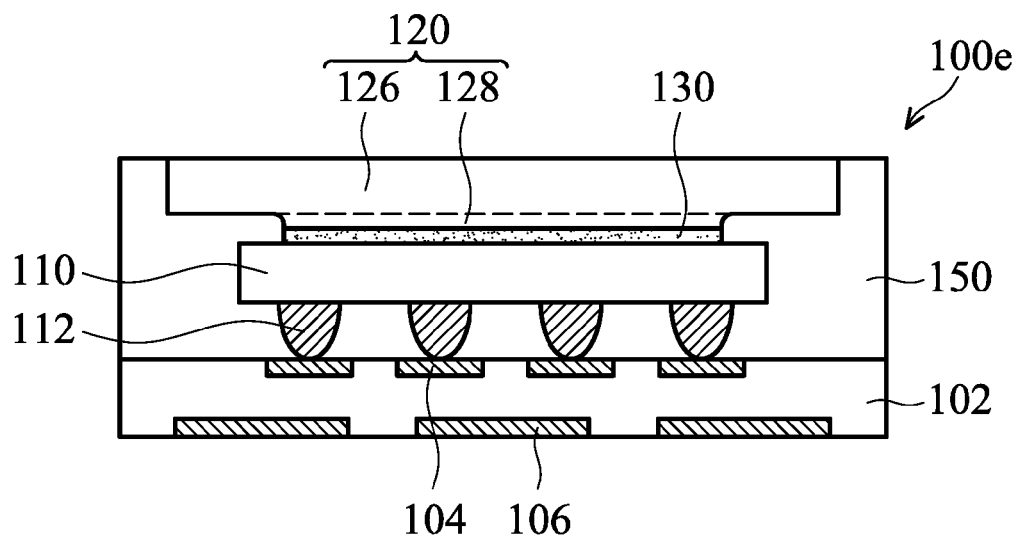

As shown in FIG. 4B, the semiconductor device structure 100e is similar to the semiconductor device structure 100d shown in FIG. 4A, except that the bottom portion 128 has rounded sidewalls which are not vertical to the top surface of the die structure 110.

Figure 4C:
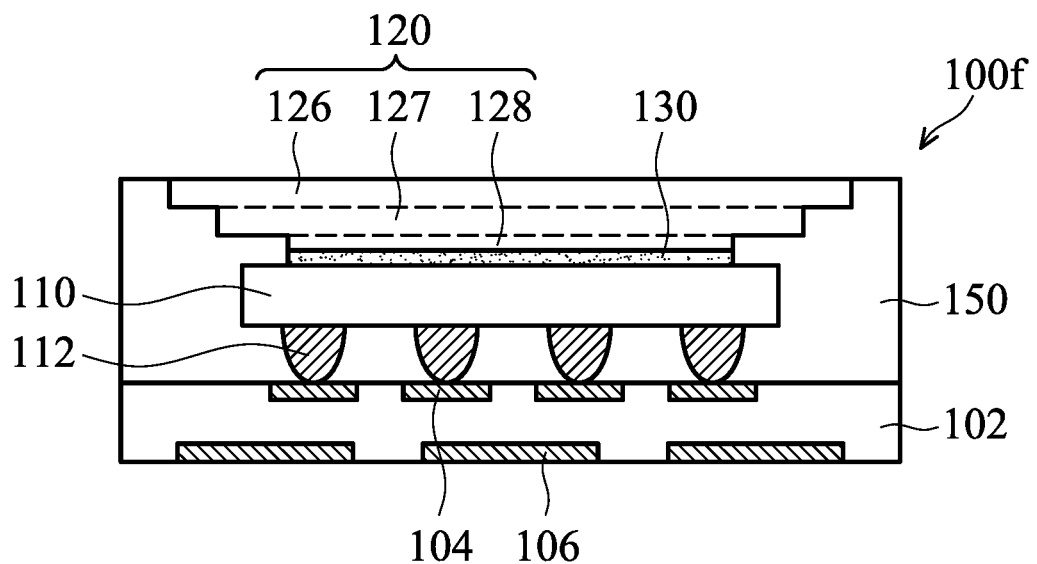

As shown in in FIG. 4C, the semiconductor device structure 100f includes the lid structure 120. The lid structure 120 includes the bottom portion 128, the top portion 128, and a middle portion 127 between the bottom portion 128 and the top portion 128. The sidewalls of the bottom portion 128, the middle portion 127 and the top portion 128 form a step-like shape. The sidewalls of the middle portion 127 are not aligned to that of the bottom portion 128.

Figure 4D:
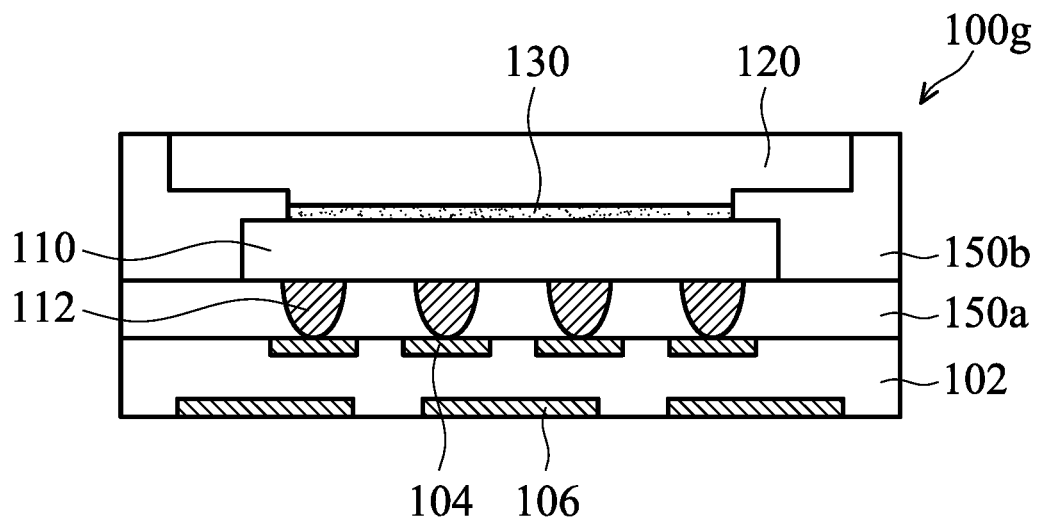

As shown in in FIG. 4D, the semiconductor device structure 100g includes the package layer 150 including a first portion 150a and a second portion 150b over the first portion 150a. The first portion 150a is formed below the die structure 110, and the second portion 150b is formed adjoining the die structure 110. In some embodiments, the first portion 150a and the second portion 150b are made of different materials. The first portion 150a may be made of underfill materials, and the second portion 150b may be made of molding compound materials.

In some embodiments, the first portion 150a is applied and cured first, and then the second portion 150b is applied over the first portion 150a. Next, the second portion 150b is cured. The first portion 150a extends laterally to the lateral edges of the electrical connectors 112. The second portion 150b extends laterally to the lateral edges of the die structure 110, the adhesion layer 130 and the lid structure 120. Therefore, the respective lateral edges of the substrate 102, the first portion 150a of the package layer 150, and the second portion 150b of the package layer 150 are coterminous.

Figure 5A:
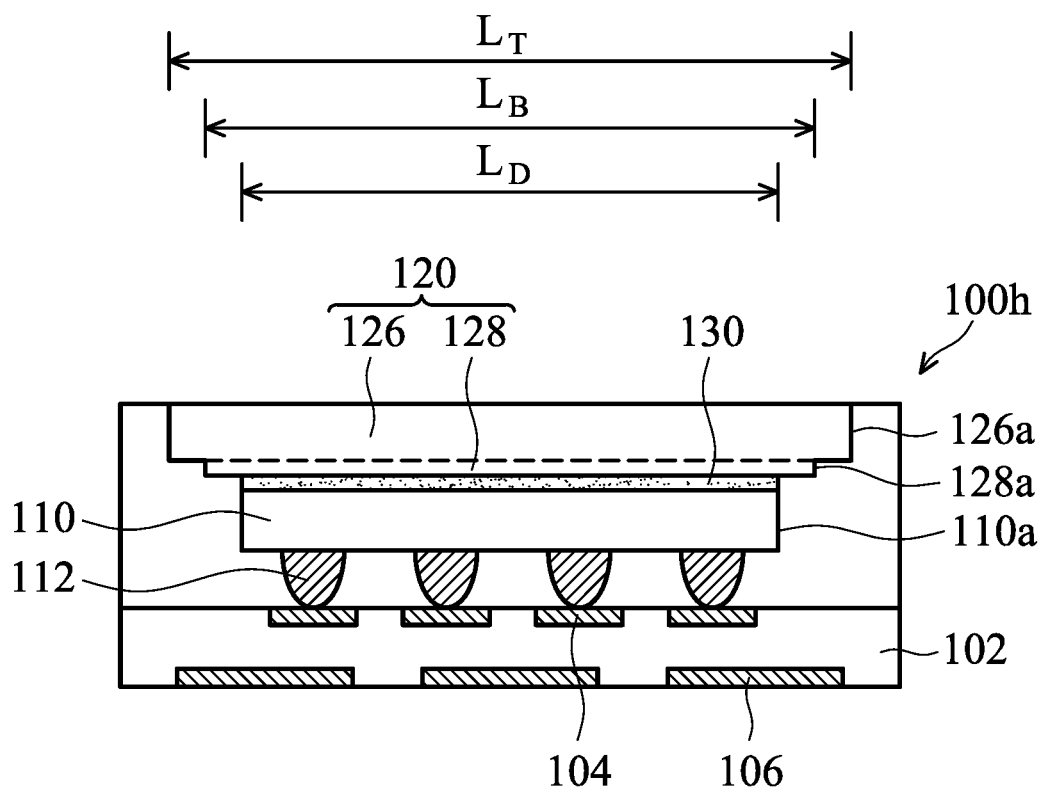
FIGS. 5A-5C shows modified embodiments of semiconductor device structures 100h-100j, in accordance with some embodiments of the disclosure.
Figure 5B:
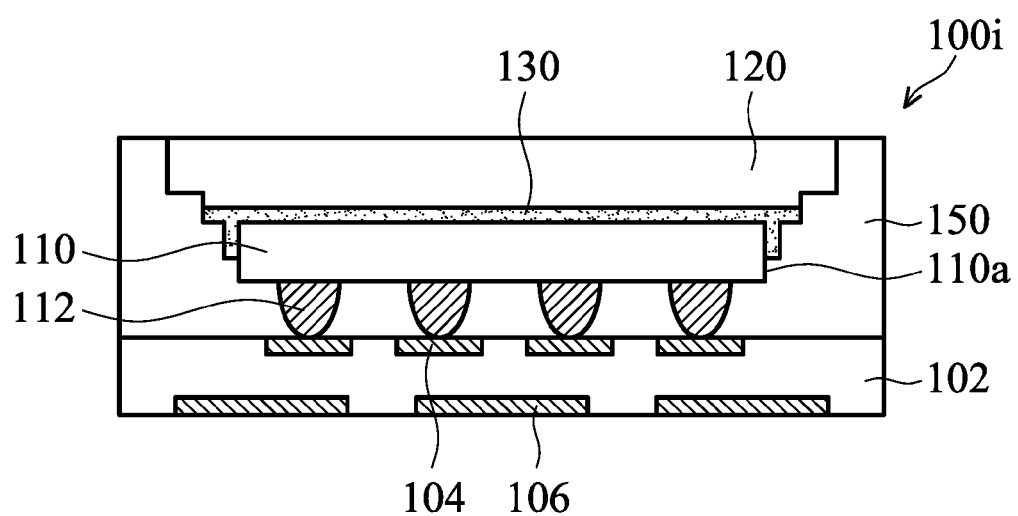
Figure 5C:
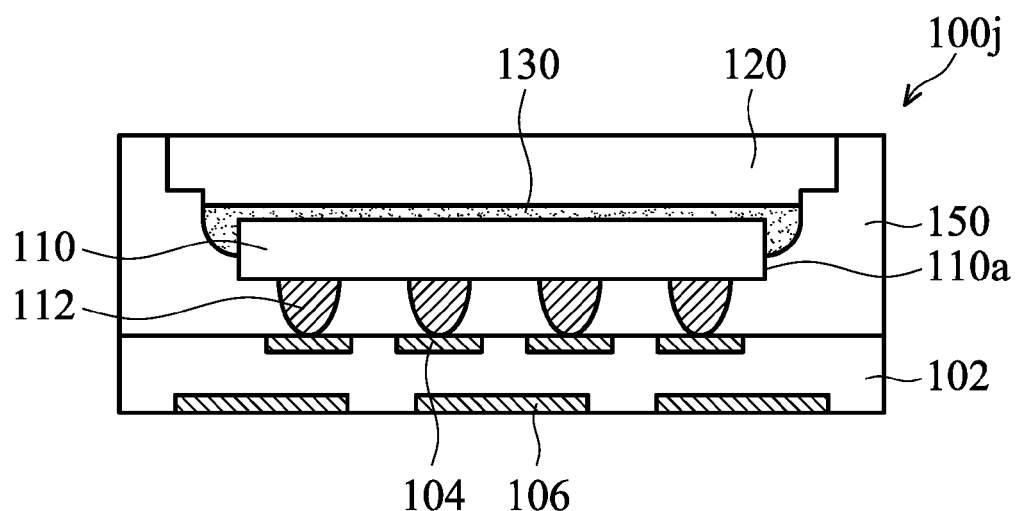

FIGS. 5A-5C shows modified embodiments of a semiconductor device structure 100h-100j, in accordance with some embodiments of the disclosure.

As shown in FIG. 5A, the lid structure 120 includes the top portion 126 and the bottom portion 128. The sidewalls 128a of the bottom portion 128 are not aligned with the sidewalls 110a of the die structure 110. More specifically, the bottom portion 128 extends beyond the sidewalls 110a of the die structure 110. A portion of the bottom surface of the bottom portion 128 is in direct contact with the package layer 150.

The top length $L_T$ is greater than the bottom length $L_B$, and the bottom length $L_B$ is greater than the die length $L_D$. The bottom portion 128 and the top portion 126 form a step-like shape.

As shown in FIG. 5B, the semiconductor device structure 100i is similar to the semiconductor device structure 100h shown in FIG. 5A, except that a portion of the adhesion layer 130 is formed over the sidewalls of the die structure 110. In other words, the portion of the adhesion layer 130 is formed between the die structure 110 and the package layer 150. The portion of the adhesion layer 130 which is formed over the sidewalls of the die structure 110 has step-like shape.

As shown in FIG. 5C, the semiconductor device structure 100j is similar to the semiconductor device structure 100i shown in FIG. 5B, except that the portion of adhesion layer 130 which is formed over the sidewalls of the die structure 110 has rounded shape.

Figure 6A:
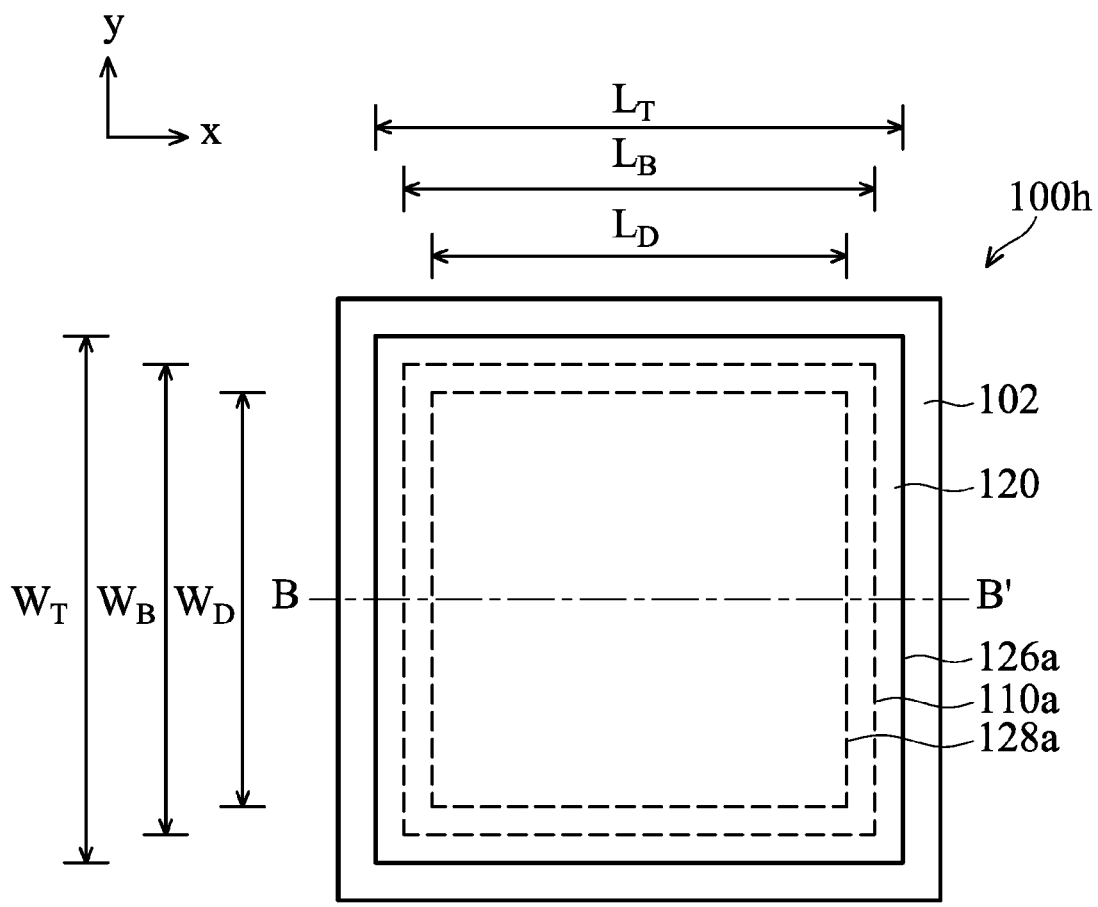
FIG. 6A shows a top-view representation of a semiconductor device structure 100h of FIG. 5A, in accordance with some embodiments of the disclosure.

FIG. 6A shows a top-view representation of the semiconductor device structure 100h of FIG. 5A, in accordance with some embodiments of the disclosure. FIG. 5A is the cross-sectional representation along the BB' line of FIG. 6A. The lid structure 120 has a rectangular or square shape when seen from top view. In the cross-sectional representation, the lid structure 120 has a T-like shape. The bottom portion 128 of the lid structure 120 and the die structure 110 are covered by the lid structure 120, and therefore the bottom portion 128 of the lid structure 120 and the die structure 110 are shown in dashed line in FIG. 2A.

Figure 6B:
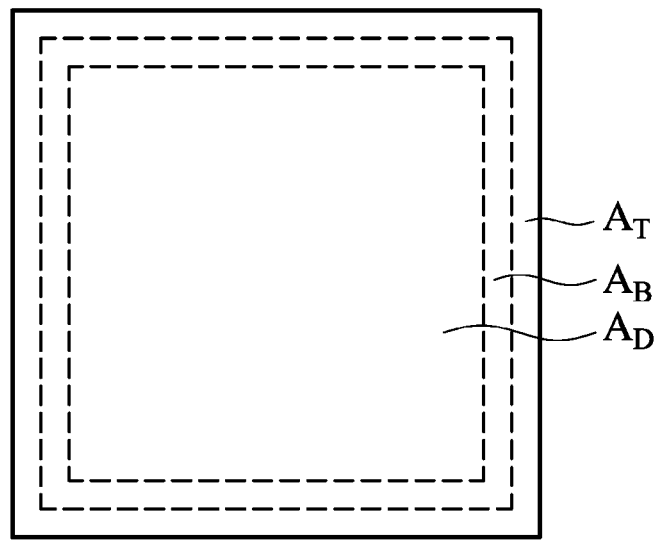
FIG. 6B shows the relationship of the areas of a top portion of a lid structure, a die structure and a bottom portion of a lid structure, in accordance with some embodiments of the disclosure.

FIG. 6B shows the relationship of the areas of the top portion of the 126 of the lid structure 120, the die structure 110 and the bottom portion 128 of the lid structure 120. The top length $L_T$ is greater than the bottom length $L_B$, and the bottom length $L_B$ is greater than the die length $L_D$. In addition, the top width $W_T$ is greater than the bottom width $W_B$, and the bottom width $W_B$ is greater than the die width $W_D$.

The top area $A_T$ is greater than the bottom area $A_B$, and bottom area $A_B$ is greater than the die area $A_D$. In some embodiments, a ratio of the bottom area $A_B$ to the die area $A_D$ is in a range from about 50% to about 100%. In some embodiments, a ratio of the die area $A_D$ to the top area $A_T$ is in a range from about 50% to about 100%. When the ratio is within the above-mentioned range, the problems associated with cracking edges and chipping dies can be avoided.

FIGS. 7A-7E shows a cross-sectional representation of a semiconductor device structure 100k, in accordance with some embodiments of the disclosure. The semiconductor device structure 100k is similar to, or the same as, the semiconductor device structure 100a shown in FIG. 1D, except that two die structures 110 are formed over the substrate 102. Processes and materials used to form semiconductor device structure 100k may be similar to, or the same as, those used to form the semiconductor device structure 100a and are not repeated herein.

Figure 7A:
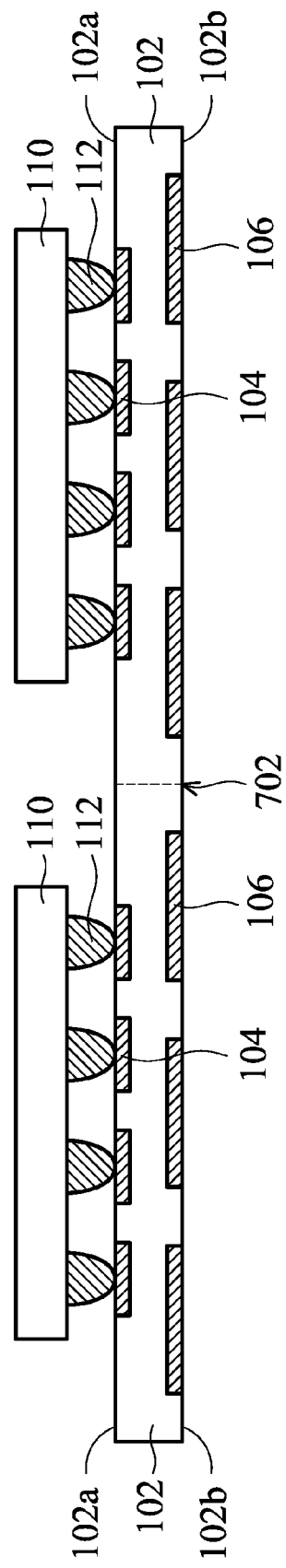
FIGS. 7A-7E shows a cross-sectional representation of a semiconductor device structure, in accordance with some embodiments of the disclosure.

As shown in FIG. 7A, two die structures 110 are formed over the substrate 102. There is a distance between every two adjacent die structures 110. A scribe line 702 is pre-designed in the substrate 102 and between two die structures 110.

Figure 7B:
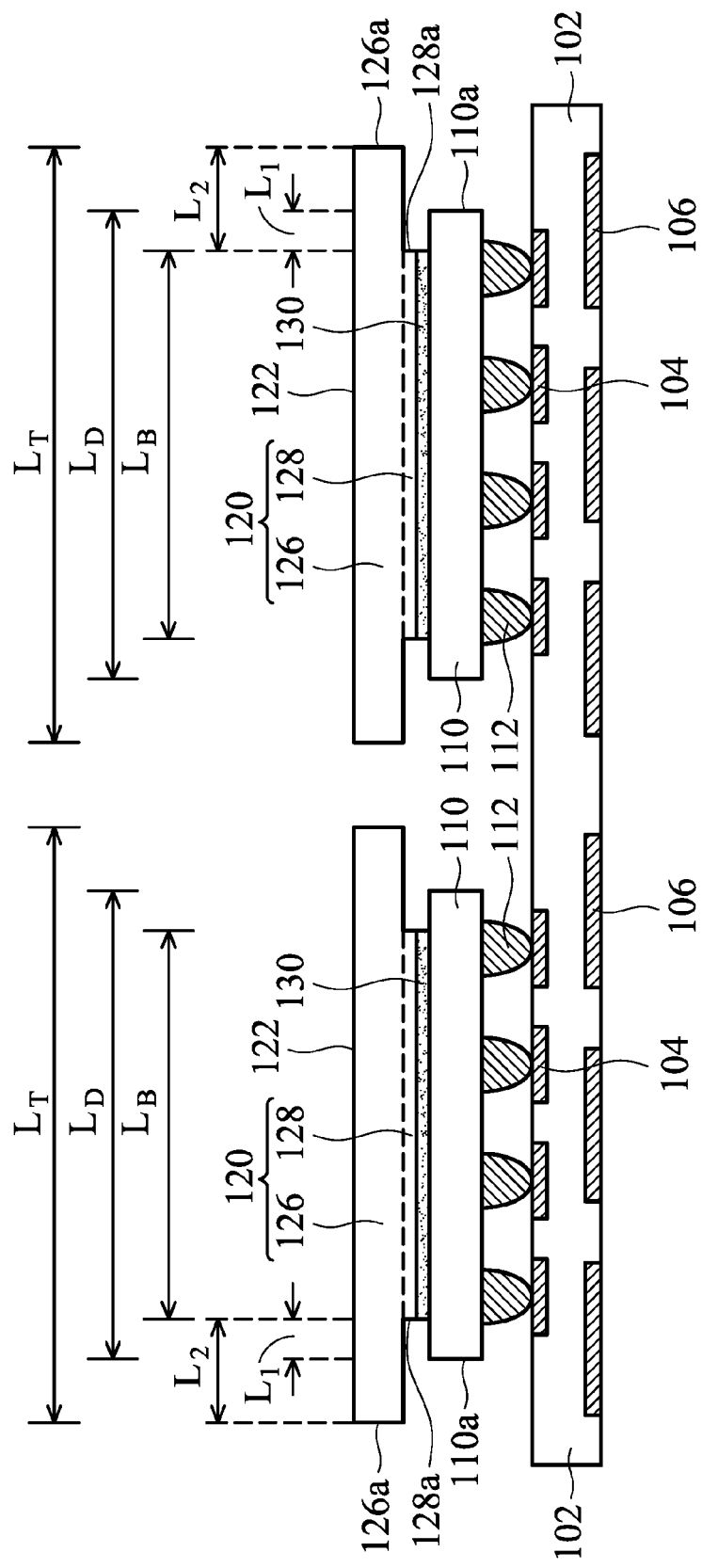
Figure 7B:
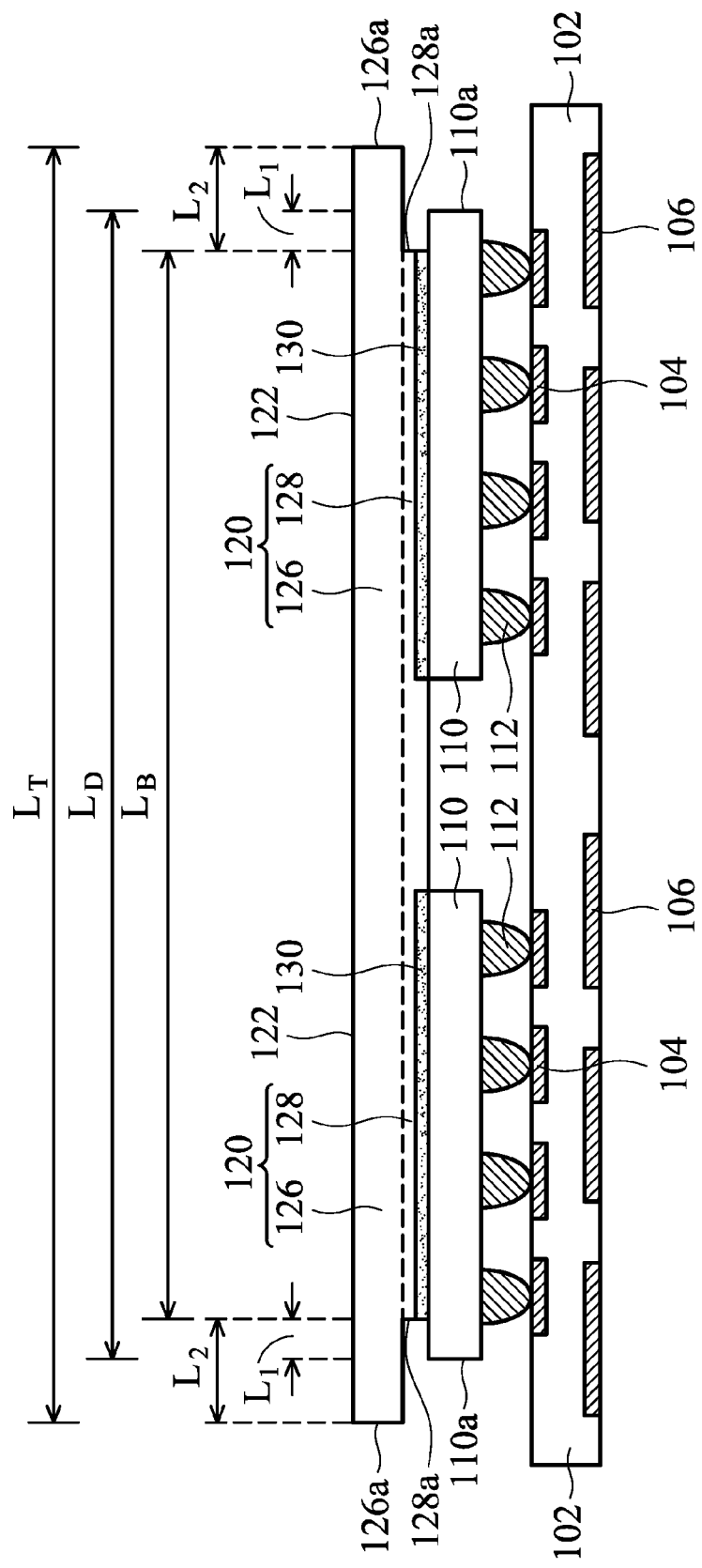

Afterwards, the lid structures 120 are formed over the die structures 110, as shown in FIG. 7B, in accordance with some embodiments of the disclosure. The left lid structure 120 and the right lid structure 120 are symmetric with each other. The two lid structures 120 both have T-like shape.

Figure 8:
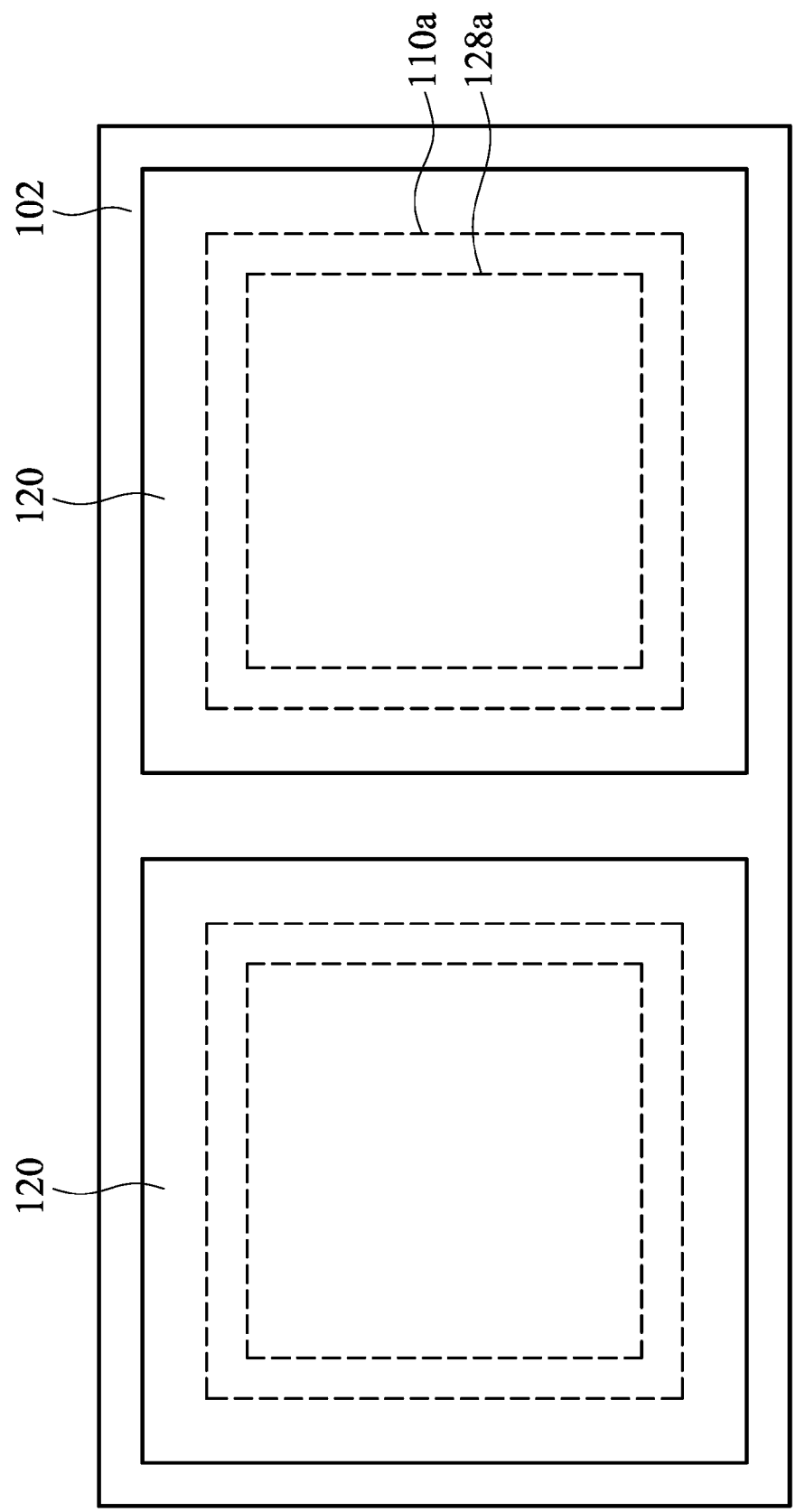
FIG. 8 shows a top-view representation of FIG. 7B, in accordance with some embodiments of the disclosure.

FIG. 8 shows a top-view representation of FIG. 7B, in accordance with some embodiments of the disclosure. Two lid structures 120 both have rectangular shape when seen from a top-view.

FIG. 7B' shows a modified embodiment of FIG. 7B, in accordance with some embodiments of the disclosure. The lid structure 120 is one layer which covers two die structures 110.

Figure 9:
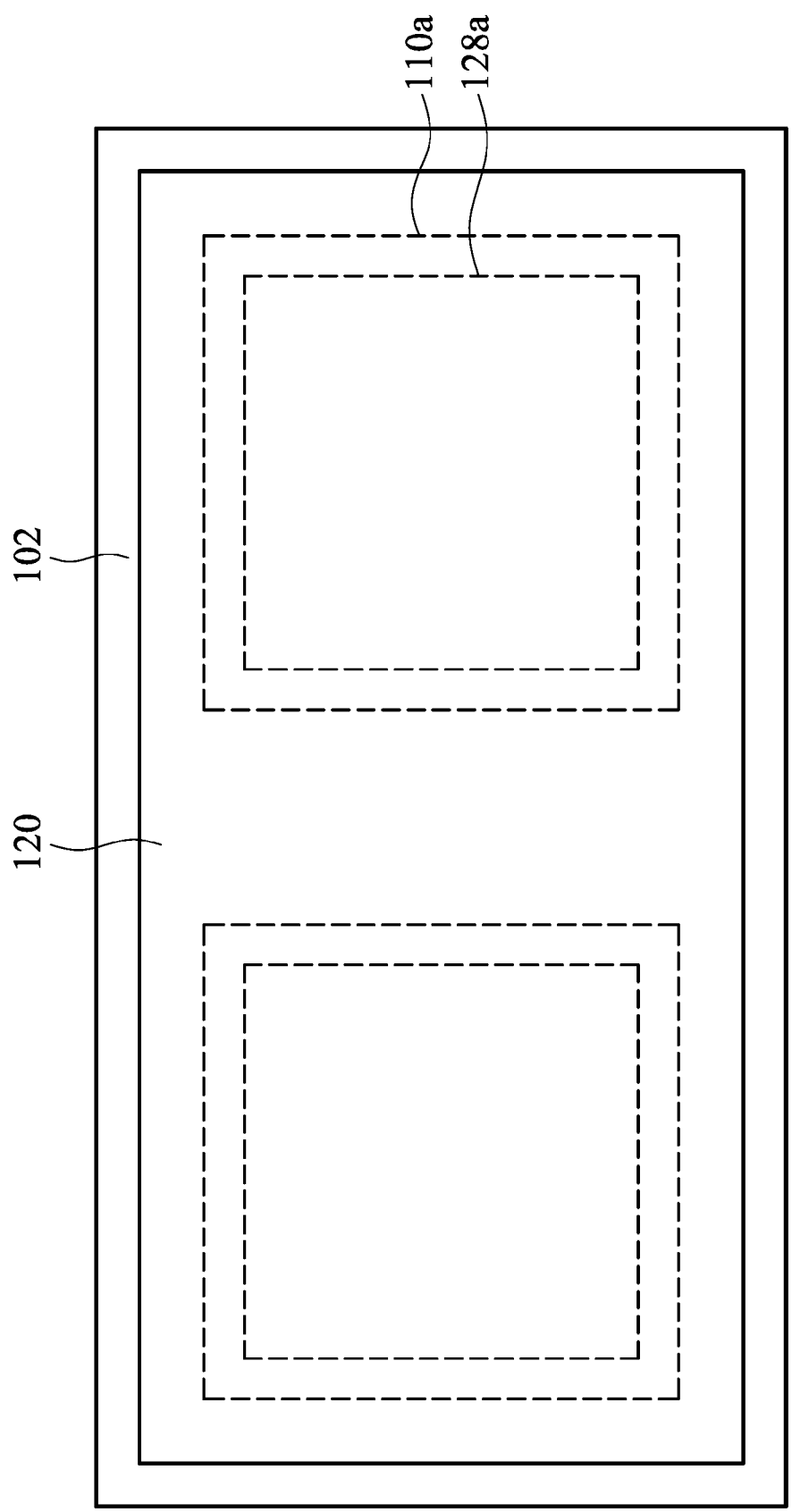
FIG. 9 shows a top-view representation of FIG. 7B', in accordance with some embodiments of the disclosure.

FIG. 9 shows a top-view representation of FIG. 7B', in accordance with some embodiments of the disclosure. The lid structure 120 has a rectangular shape when seen from a top-view.

Figure 7C:
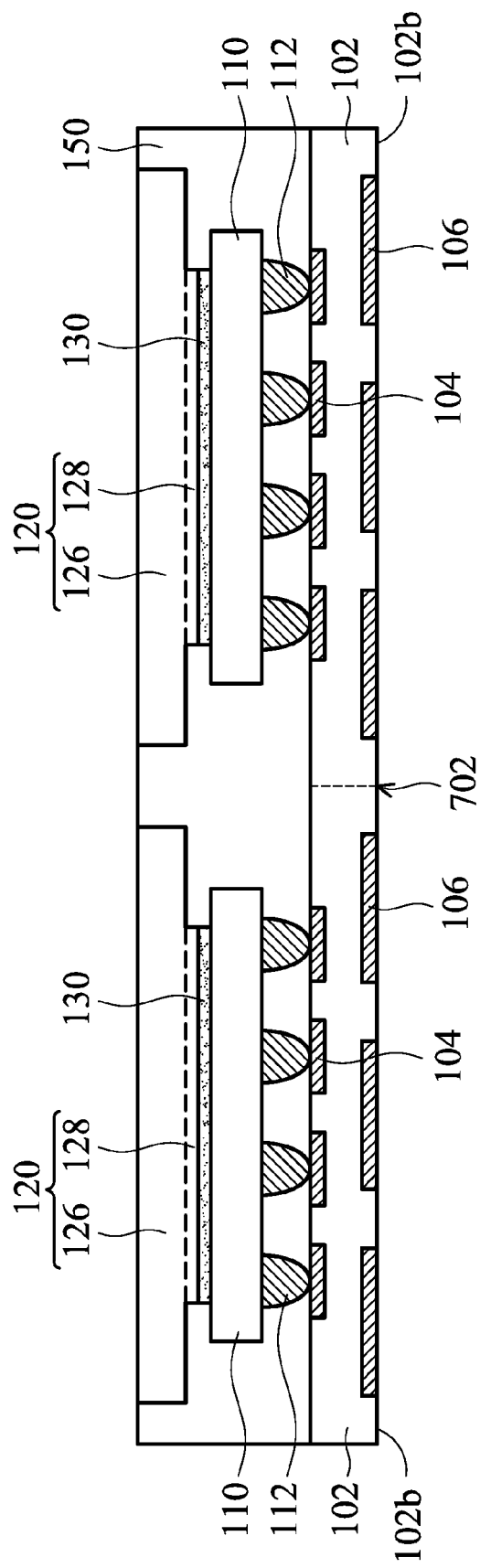

After the lid structures 110 are formed as shown in FIG. 7B, the package layer 150 is formed over the substrate, as shown in FIG. 7C, in accordance with some embodiments of the disclosure.

Figure 7D:
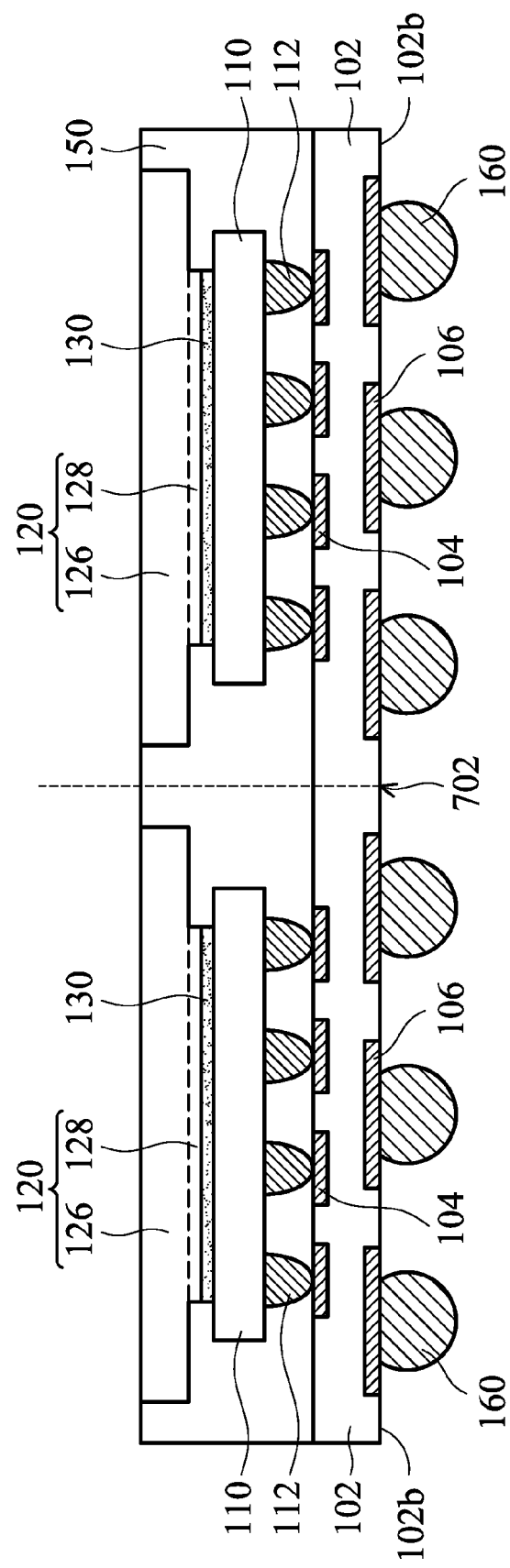

Afterwards, the electrical connectors 160 are formed over the pads 106 at the back side 102b of the substrate 102, as shown in FIG. 7D, in accordance with some embodiments of the disclosure.

Figure 7E:
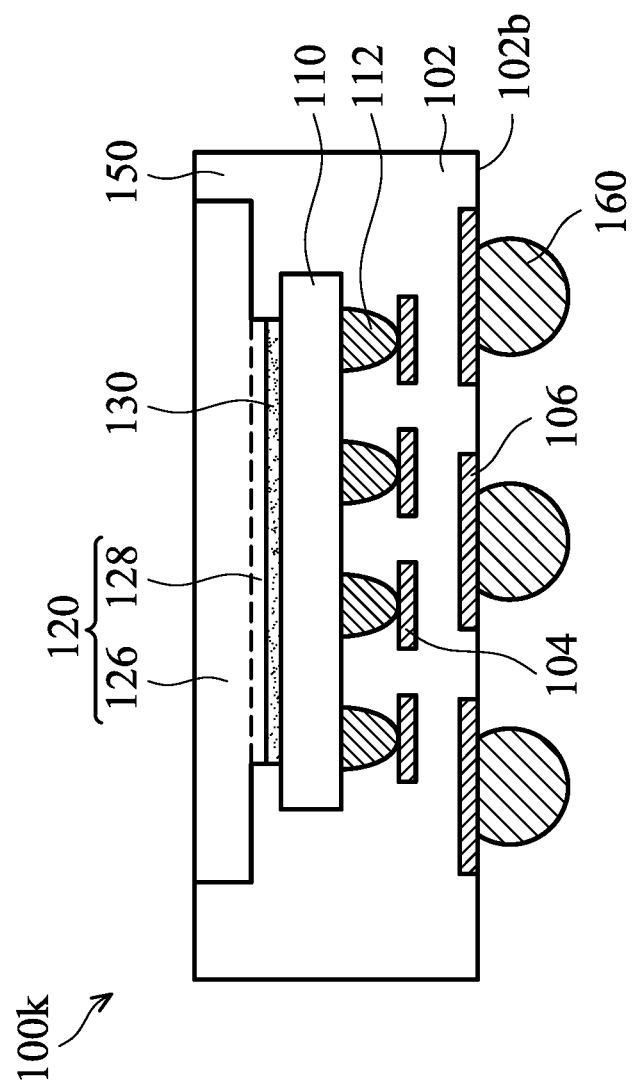

Afterwards, the package layer 150 and the substrate 102 are singulated along the scribe line 702 by a singulation process to form two individual semiconductor device structures 100k, as shown in FIG. 7E, in accordance with some embodiments of the disclosure. Therefore, the left die structure 110 and the right die structure 100 are separated. In some embodiments, the package layer 150 and the substrate 102 are singulated using a die saw, a laser, or another device to form a number of die structures 110.

If the electrical connectors are formed after the singulation process, the electrical connectors are formed on a relatively small substrate which has been singulated. Compared with that, the electrical connectors 160 as shown in FIG. 7D, are formed before the singulation process, the electrical connectors 160 are formed on a relatively large substrate which is not divided yet. Therefore, the throughput or yields for forming the electrical connectors 160 is increased. In addition, the production yields of the semiconductor device structures 100k are improved.

In a comparative embodiment, the die structure is formed first, and next the package layer is formed over the die structure. Next, the singulation process is performed to form a single die structure. After the singulation process, the die structure is transported to a tray which serves as a temporary container for storing the single die structure. In order to form the lid structure covering the die structures, the die structures have to be transported from the tray to a boat. After formation of the lid structure, the die structures will be transported back to the tray. Compared with the comparative embodiments, the fabrication process of the embodiments of the disclosure, as shown in FIGS. 7A-7E, is reduced. Furthermore, the throughout or yields for forming the electrical connectors 160 is increased. The risks of die cracking, die chipping, and warpage are decreased. Therefore, the performance of the semiconductor device structure is improved.

Embodiments for forming a semiconductor device structure and method for formation of the same are provided. A semiconductor device structure includes a die structure formed over a substrate. A lid structure formed over the die structure. The lid structure includes a bottom portion and a top portion over the bottom portion. The sidewalls or edges of the top portion or the bottom portion are not aligned with the sidewalls of the die structure to reduce edge stress.

Therefore, the risk of edge cracking or die chipping is reduced, and the performance of the semiconductor device structure is improved.

In some embodiments, a semiconductor device structure is provided. The semiconductor device structure includes a substrate and a die structure formed over the substrate. The semiconductor device structure also includes a lid structure formed over the die structure. The lid structure includes a top portion with a top length and a bottom portion with a bottom length, and the top length is greater than the bottom length. The semiconductor device structure also includes a package layer formed between the lid structure and the die structure, and a sidewall of the bottom portion of the lid structure is not aligned with a sidewall of the die structure.

In some embodiments, a semiconductor device structure is provided. The semiconductor device structure includes a substrate and a die structure formed over the substrate. The semiconductor device structure also includes a lid structure formed over the die structure. A portion of a top surface of the die structure is not covered by the lid structure to form a recess directly on the portion of the top surface of the die structure. The semiconductor device structure also includes a package layer formed in the recess and around the die structure.

In some embodiments, a method for forming a semiconductor device structure is provided. The method includes forming a first die structure on a substrate and forming a lid structure over the die structure. An edge of the lid structure is not aligned with an edge of the die structure to form a recess. The method includes forming a package layer in the recess and around the first die structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a die structure formed over a substrate, the die structure having a die length;
    an adhesion layer formed over a top surface and on sidewalls of the die structure;
    a lid structure attached to the top surface of the die structure by the adhesion layer, wherein the lid structure comprises a top portion with a top length and a bottom portion with a bottom length, the top length being greater than the bottom length, and the bottom length being greater than the die length; and
    a package layer formed on sidewalls of the lid structure and the die structure, wherein a sidewall of the bottom portion of the lid structure is not aligned with a sidewall of the die structure.

2. The semiconductor device structure as claimed in claim 1, further comprising:
    a plurality of electrical connectors formed under the die structure, wherein the electrical connectors are electrically connected to a plurality of pads in the substrate, the plurality of pads being directly under the die structure.

3. The semiconductor device structure as claimed in claim 1, wherein a sidewall of the adhesion layer has a step-like shape.

4. The semiconductor device structure as claimed in claim 1, further comprising:
    a ring structure formed adjacent to the die structure, wherein the die structure is surrounded by the ring structure, and wherein a topmost surface of the ring structure is level with or higher than the top surface of the die structure in a cross-sectional view.

5. The semiconductor device structure as claimed in claim 1, wherein the top portion extends beyond the sidewalls of the die structure along a horizontal direction.

6. The semiconductor device structure as claimed in claim 5, wherein the bottom portion of the lid structure has sloped sidewalls or rounded sidewalls.

7. The semiconductor device structure as claimed in claim 1, wherein the lid structure further comprises a middle portion between the top portion and the bottom portion, wherein the sidewalls of the bottom portion, the sidewalls of the middle portion and the sidewalls of the top portion form a step-like shape.

8. The semiconductor device structure as claimed in claim 1, wherein the package layer comprises a first portion and a second portion, the first portion is formed below the die structure, and the second portion is formed adjoining the die structure.

9. The semiconductor device structure as claimed in claim 1, wherein a sidewall of the adhesion layer, a sidewall of the bottom portion of the lid structure, and a sidewall of the top portion of the lid structure together form a step-like shape.

10. The semiconductor device structure as claimed in claim 1, wherein portions of the adhesion layer formed on the sidewalls of the die structure have a rounded shape.

11. A semiconductor device structure, comprising:
    at least two die structures formed over a substrate;
    an adhesion layer formed over a top surface and coplanar with at least one edge of each die structure and non-coplanar with another edge of each die structure;
    a single lid structure formed over the at least two die structures, wherein a portion of a top surface of each die structure is not covered by the lid structure to form a recess directly on the portion of the top surface of each die structure; and
    a package layer formed in each recess and around the die structures.

12. The semiconductor device structure as claimed in claim 11, wherein the lid structure comprises a main portion and an extending portion above the main portion, end portions of the extending portion extending beyond sidewalls of the die structures along a horizontal direction.

13. The semiconductor device structure as claimed in claim 12, wherein the main portion comprises sidewalls which are not aligned with sidewalls of the die structures.

14. The semiconductor device structure as claimed in claim 12, wherein the main portion and the extending portion form a T-like shape.

15. The semiconductor device structure as claimed in claim 11, further comprising:
    an adhesion layer formed between the lid structure and the die structures.

16. The semiconductor device structure as claimed in claim 11, wherein the lid structure comprises a main portion and an extending portion above the main portion, and wherein the main portion comprises a lower portion extending between the at least two die structures, a bottom surface of the lower portion being coplanar with a top surface of the at least two die structures.

17. A method for forming a semiconductor device structure, comprising:
 forming a die structure on a substrate;
 forming an adhesion layer on a top surface and sidewalls of the die structure;
 forming a lid structure over the die structure, wherein the lid structure comprises a main portion attached to the die structure by the adhesion layer and an extending portion over the main portion, wherein sidewalls of the main portion extend laterally beyond sidewalls of the die structures and sidewalls of the extending portion extend laterally beyond sidewalls of the main portion; and
 forming a package layer around the die structure.

18. The method for forming the semiconductor device structure as claimed in claim 17, further comprising:
 forming a plurality of pads in the substrate; and
 forming a plurality of connectors below the die structure, wherein the connectors are electrically connected to the pads.

19. The method for forming the semiconductor device structure as claimed in claim 17, wherein sidewalls of the adhesion layer form a step-like shape.

20. The method for forming the semiconductor device structure as claimed in claim 17, wherein forming the lid structure over the die structure comprises forming a main portion, the main portion attached to the die structure by the adhesion layer, and forming an extending portion over the main portion, wherein sidewalls of the main portion extend laterally beyond sidewalls of the die structure and sidewalls of the extending portion extend laterally beyond sidewalls of the main portion.

* * * * *